United States Patent [19]

Kida et al.

[11] Patent Number: 4,911,895
[45] Date of Patent: Mar. 27, 1990

[54] APPARATUS FOR GROWING CRYSTALS OF SEMICONDUCTOR MATERIALS

[75] Inventors: Michio Kida, Urawa; Kensho Sahira, Yono, both of Japan

[73] Assignee: Mitsubishi Kinzoku Kabushiki Kaisha, Tokyo, Japan

[21] Appl. No.: 201,017

[22] Filed: Jun. 1, 1988

[30] Foreign Application Priority Data

Jun. 8, 1987 [JP] Japan .................. 62-142459

[51] Int. Cl.$^4$ .................. C30B 15/10; C30B 15/14
[52] U.S. Cl. .................. 422/245; 156/617.1; 422/249
[58] Field of Search .................. 156/617.1; 422/249, 422/245

[56] References Cited

U.S. PATENT DOCUMENTS

| | | | |
|---|---|---|---|
| 2,977,258 | 3/1961 | Dunkle | 156/617.1 |
| 3,567,397 | 3/1971 | O'Hara et al. | 23/273 |
| 3,892,739 | 6/1959 | Rusler et al. | 148/1.5 |
| 4,235,848 | 11/1980 | Sokolov et al. | 156/617.1 |
| 4,246,064 | 1/1981 | Dewees et al. | 156/617.1 |
| 4,330,361 | 5/1982 | Kohnefeld et al. | 422/249 |

FOREIGN PATENT DOCUMENTS

| | | |
|---|---|---|
| 0170856 | 6/1985 | European Pat. Off. . |
| 61-36197 | 2/1986 | Japan . |
| 939102 | 10/1963 | United Kingdom . |
| 2188854-A | 10/1987 | United Kingdom .............. 156/617.1 |

OTHER PUBLICATIONS

Patent Abstracts of Japan, Tanaka Kikinzoku Kogyo K.K., vol. 8, No. 126 Patent Abstracts of Japan, Sony K.K., vol. 4, No. 81.

*Primary Examiner*—Upendra Roy
*Attorney, Agent, or Firm*—Cushman, Darby & Cushman

[57] ABSTRACT

An apparatus for growing a semiconductor crystal from a melt includes a susceptor, a quartz crucible, at least one reinforcing ring, and a heater. The crucible is housed in the susceptor for receiving a semiconductor material therein. The reinforcing ring is provided on the quartz crucible for enhancing the strength of the crucible. The heater is disposed so as to surround the susceptor for heating the semiconductor material contained in the crucible.

4 Claims, 2 Drawing Sheets

APPARATUS FOR GROWING CRYSTALS OF SEMICONDUCTOR MATERIALS

BACKGROUND OF THE INVENTION

1. Field of the Invention

The present invention pertains to an apparatus for growing crystals of semiconductor materials for use in making integrated circuit devices and solar cells, for example. More particularly, the invention relates to such apparatus which operates in accordance with a Cochralski technique making use of a quartz crucible.

2. Prior Art

In a batch type apparatus for the growing of silicon single-crystal ingots, the quantity of a silicon melt contained in a quartz crucible decreases as the crystal grows. As a result, the quality is not uniform longitudinally within the crystalline ingot obtained by the apparatus of this type. More specifically, the oxygen concentration in the crystal depends upon the quantity of oxygen dissolved in the silicon melt, thereby varying as the silicon melt in the quartz crucible varies. In addition, since the quantity of the melt varies, the thermal distribution in the furnace fluctuates and the convection in the melt varies, so that the crystallization front varies. Further, dopant such as phosphorus, boron and antimony is generally added to the melt to control the electric conductivity of the single-crystal. However, insomuch as the segregation constant of such impurities is not identical to 1, the dopant concentration in the crystal differs as the crystal grows.

Thus, the quality of the single-crystal ingot varies in its longitudinal direction, and therefore it has been only a part of the ingot that has a desired quality. Additionally, the productivity has been low in such batch process.

The approach to resolve the above disadvantages is the use of a continuous type apparatus hitherto proposed wherein the single-crystal ingot is grown while the quartz crucible is being charged with a material. U.S. Pat. No. 2,892,739 or Japanese Patent application A-Publication No. 61-36197 describes one such apparatus which is the simplest in structure and makes use of the combination of a double crucible and the continuous charging of the material in the form of powders, lumps or granules.

In the above continuous type apparatus, however, the temperature of the silicon melt is above 1,420° C., and the quartz of which the crucible is made begins to get softened at about 1,100° C. As a result, although the outer crucible member supported by a graphite susceptor is not deformed from its original shape so greatly, the inner crucible member is susceptible to a large deformation since it is not supported sufficiently, so that the growing of the single-crystal is adversely affected. FIGS. 1 and 2 of the accompanying drawings schematically illustrate a conventional apparatus which comprises a quartz double crucible 100 housed in a susceptor 102 and consisting of inner and outer crucible members 100a and 100b, and a resistance heater 104 disposed so as to surround the crucible 100. The double crucible 100 is filled with a charge of silicon material 106, as shown in FIG. 1, and the charge is heated by the heater 104 until it is melted thoroughly. Each inner crucible member 100a, however, is subjected to deformation as shown in FIG. 2 as the silicon material is melted.

SUMMARY OF THE INVENTION

It is therefore an object of the present invention to provide an improved apparatus for growing semiconductor crystals in which a quartz crucible can be prevented in advance from being deformed during the melting of the material.

According to the present invention, there is provided an apparatus for melting a semiconductor material and growing a semiconductor crystal from the melted material comprising a susceptor; a quartz crucible housed in the susceptor for receiving the semiconductor material therein; at least one reinforcing ring provided on the quartz crucible; and heating means disposed so as to surround the susceptor for heating the semiconductor material contained in the crucible.

DESCRIPTION OF PREFERRED EMBODIMENTS OF THE INVENTION

Figure 4:
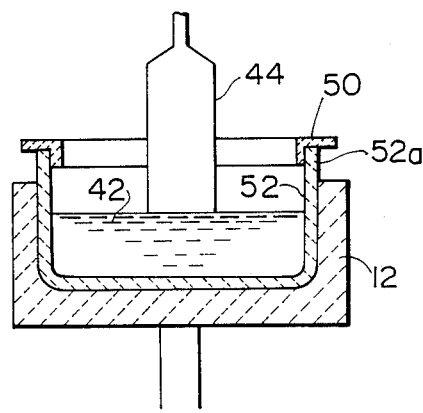
FIG. 4 is a schematic vertical cross-sectional view of a modified crystal growing apparatus in accordance with the present invention.

Various embodiments of the present invention will now be described with reference to FIGS. 3 to 5 of the accompanying drawings in which the same reference characters are used to designate like parts or elements in several views.

Figure 3:
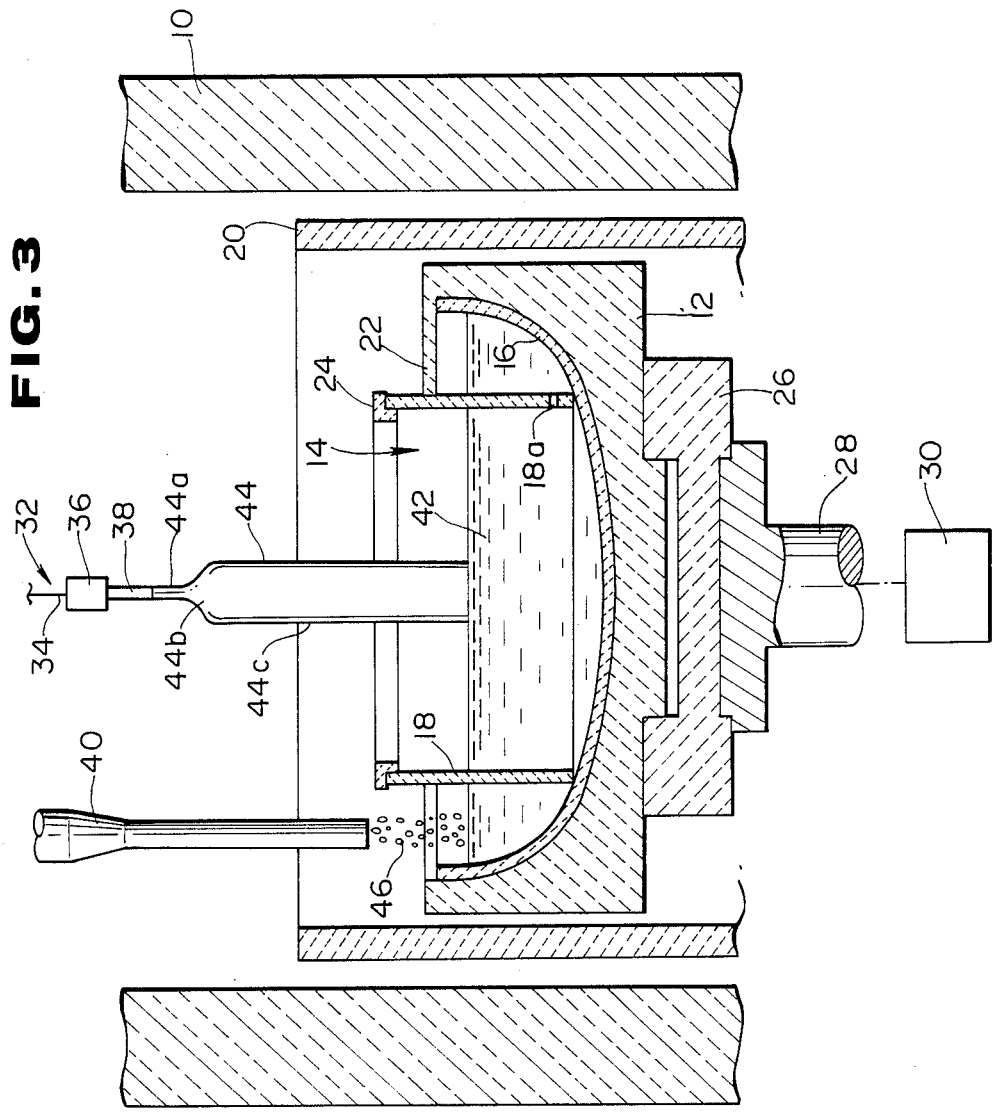
FIG. 3 is a vertical cross-sectional view of a crystal growing apparatus provided in accordance with the present invention.

Referring to FIG. 3, there is illustrated an apparatus for growing a silicon single-crystal ingot from a melt. The apparatus comprises a heat reserving shell 10 housed in a furnace (not shown), a susceptor or a support bowl 12 of graphite accommodated within the heat reserving shell 10, a double crucible 14 consisting of outer and inner crucible members 16 and 18, and heating means in the form of a resistance heater 20 disposed within the shell 10 so as to surround the graphite susceptor 12. The outer crucible member 16 is of a deep dish shape and positioned within and supported by the susceptor 12 with its outer surface held contact with an inner surface of the susceptor 12. The inner crucible member 18 is of a cylindrical shape smaller in diameter than the outer crucible member 16, and is housed within the outer crucible member 16 with the lower end resting on the inner surface of the outer crucible member 16. A plurality of, say three, radially-inwardly extending graphite arms 22, which are fixedly secured at their outer ends to the upper end of the susceptor 12, are fixedly secured at their inner ends to the outer peripheral surface of the inner crucible member 18, and thus the inner crucible member 18 is firmly supported by the susceptor 12 through the graphite arms 22. Although not clearly seen from the drawings, the arms 22 are disposed in circumferentially equally spaced relation to each other. The inner crucible member 18 includes a plurality of apertures or fluid passages 18a formed therethrough and disposed adjacent to its lower end. Such apertures 18a permit the flow of molten material toward and away from the inner crucible member 18, from and to an annular space defined between the peripheral walls of the outer and inner crucible members 16 and 18. Mounted on the upper end of the inner crucible member 18 is a reinforcing ring 24 of graphite which is of a generally L-shaped cross section and has a pair of opposed angularly-converging peripheral surfaces. The ring 24 is firmly fitted on the upper end of the inner crucible member 18 with one of the peripheral surfaces resting on an upper end face thereof and with the other peripheral surface mated with the marginal portion of an inner peripheral surface thereof.

The susceptor 12 is mounted on a pedestal 26 which is situated on a shaft 28 drivingly connected to a main drive mechanism 30 which permits the vertical movement and axial rotation of the shaft 28 during operation. There is also provided a crystal pulling mechanism 32 of a conventional type which comprises a pulling wire 34, retaining means 36 secured thereto for retaining a seed crystal 38 and a drive mechanism (not shown) for pulling and rotating the wire 34. In the illustrated embodiment, the wire is rotated as usual in a direction opposite to the rotation of the double crucible 14. Further, a feed pipe 40 is provided for charging the annular space defined between the peripheral walls of the outer and inner crucible members 16 and 18 with a new silicon material.

In operation, the double crucible 14 is first filled with a charge of polycrystal silicon material. Then, the air in the furnace is replaced by argon gas thoroughly, and an electric power is applied to the heater 20 to elevate the temperature in the furnace. As a result, the charge is heated to a prescribed temperature and becomes molten as at 42. After the silicon material is melted completely, the temperature of the silicon melt 44 in the double crucible 14 is regulated optimally by the heater 22, and the growing of a single-crystal ingot is commenced in a usual manner. Namely, while rotating the double crucible 14 at a prescribed rate, the seed crystal 38 is lowered and placed in contact with the surface of the melt 42 until the crystal commences to form about the seed, at which time the seed crystal 38 is withdrawn at prescribed rate while being rotated. As a result, a single-crystal ingot 44 is grown and withdrawn in the order of a neck portion 44a, a shoulder portion 44b and a main rod portion 44c. As the crystal grows, the level of the melt 42 goes down. However, a new silicon material 46 in granular form is continuously introduced into the annular space through the feed pipe 40 and hence the material in the double crucible 14 is replenished so that the melt level remains essentially constant.

In the foregoing, a great quantity of heat is applied to the double crucible 14 during the melting of the charge initially contained in the double crucible 14. If there should not be provided the reinforcing ring 24, the upper portion of the inner crucible member 18 would be deformed inwardly downwardly thereof in an undulatory fashion when viewed in plan. In the apparatus described above, however, by virtue of the provision of the graphite reinforcing ring 24, the inner crucible member 18 is not susceptible to such deformation. The provision of such ring 24 is very simple but really effective in enhancing the strength of the inner crucible member 18 during operation. Further, the graphite ring 24 has an additional advantage a described hereinafter.

Namely, the silicon melt 42 reacts on the quartz crucible and volatile silicon monoxide is produced during the operation. If there should not be provided such ring, the silicon monoxide vapor would be likely to be deposited on the upper end of the inner crucible member since the upper end is relatively cold and considerably burred although it is chamfered. The silicon monoxide thus deposited on the upper end of the inner crucible ember may drop into the melt due to its own weight or the flow of argon gas in the furnace, and may adhere to the solid-liquid interface in the growing crystal, thereby deteriorating the quality of the single-crystal, or resulting in a formation of polycrystal in some cases. In the apparatus of the invention, however, the silicon monoxide vapor contacting the graphite ring 14 is reacted with graphite to produce carbon monoxide gas according to the following substitution reaction:

$$2C + SiO \rightarrow SiC + CO \uparrow$$

The carbon monoxide gas thus produced is never deposited on the crucible, thus permitting the single-crystal ingot of a high quality to be grown smoothly.

While the present invention has been specifically shown and described herein, many modifications and variations are possible in the light of the above teachings. For example, although in the above embodiment, the ring 24 is made of graphite, it may be made o a transition metal having a high melting point such as niobium, molybdenum, tantalum and tungsten, or of a carbide of a suitable element such as these metals. If germanium ingots are being grown, steel or nickel may be also used. However, in order to circumvent the problems with the silicon monoxide vapor, graphite or carbide may be most preferable. In particular, the ring may be more preferably made of a porous material of graphite or metal carbide in order to ensure the capture of the silicon monoxide vapor.

Figure 1:
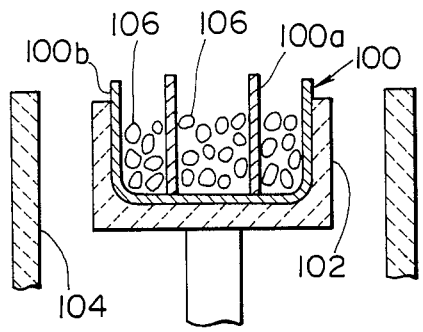
FIG. 1 is a schematic vertical cross-sectional view showing a conventional crystal growing apparatus making use of a double crucible.
Figure 2:
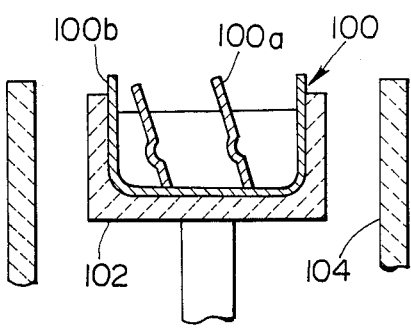
FIG. 2 is a view similar to FIG. 1, but showing how an inner crucible member thereof is deformed during the melting of a charge in the double crucible.

Further, although in the above embodiment, the reinforcing ring 24 is mounted on the inner crucible member of the type which is supported by the susceptor 12 through the arms 22, it may be mounted on an inner crucible member as shown in FIG. 1, in which only the lower end is fixedly secured to the outer crucible member. Since such inner crucible member would deform such that it would become inclined as shown in FIG. 2, its upper end portion would be deformed into a generally elliptical shape. The provision of the reinforcing ring, however, prevents such deformation very effectively. Further, although the ring is disposed on the upper end of the inner crucible in the embodiment, it may be disposed on another portion. It, however, should be preferably disposed on that portion of the quartz crucible located above a level of the melted material.

Further, a cap of silicon carbide or quartz may be fitted on each arm 22 for the purpose of preventing the silicon material from contacting the surface of the arm which is made of graphite. In order to attain the same purpose, the arm may be lined with such a material.

In addition, although not illustrated by the drawings, a flat-bottomed inner crucible member may be utilized instead of the inner crucible member 18. Further, the double crucible may be replaced by a conventional single-wall crucible or a multi-wall crucible with more than two walls. FIG. 4 schematically shows such a single wall crucible in which a reinforcing ring 50 formed of a material such as graphite, metal carbide and the like is mounted on an upper end 52a of the peripheral wall of a crucible 52. Moreover, the apparatus of the present invention may also be applicable to a batch process although in the batch process, the crucible has to be gradually lifted during crystal growth to maintain an essentially fixed crystallization front.

Figure 5:
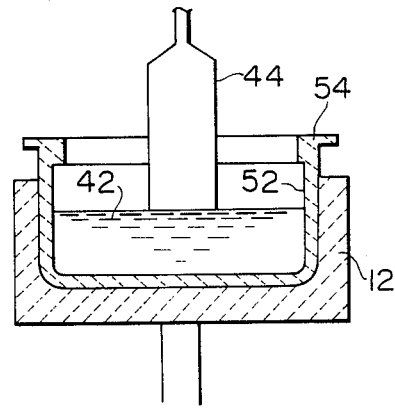
FIG. 5 is a view similar to FIG. 4, but showing another modified apparatus in accordance with the present invention.

Furthermore, in those cases where only the reinforcing of the crucible is required, the quartz crucible 52 may be provided with a ring 54 formed integrally therewith a schematically shown in FIG. 5.

What is claimed is:

1. An apparatus for melting a semiconductor material and growing a semiconductor crystal from the melted material, comprising:
   (a) a susceptor;
   (b) a quartz crucible housed in said susceptor for receiving the semiconductor material therein;
   (c) a reinforcing ring disposed on an upper end of said quartz crucible, said reinforcing ring being structurally distinct from said crucible and being made of a material selected from the group consisting of graphite and carbide, said reinforcing ring being of a generally L-shaped cross section having a pair of opposed angularly converging peripheral surfaces and being fitted on said upper end of said crucible with one of the peripheral surfaces resting on an upper end face thereof and with the other peripheral surface mated with an inner peripheral surface thereof; and
   (d) heating means disposed so as to surround said susceptor for heating the semiconductor material contained in said crucible.

2. A semiconductor crystal growing apparatus according to claim 1, in which said ring is made of a porous material.

3. A semiconductor crystal growing apparatus according to claim 1, in which said crucible includes an outer crucible member housed in nd supported by said susceptor and an inner crucible member placed within said outer crucible member so as to define a multi-wall structure, said ring being disposed on said inner crucible member.

4. A semiconductor crystal growing apparatus according to claim 3 in which said inner crucible member is of an annular shape, and further comprising a plurality of support members each having one end fixedly secured to said susceptor and the other end fixedly secured to said inner crucible member, whereby said inner crucible member is supported by said susceptor through said support members.

* * * * *